(12) United States Patent
Chen et al.

(10) Patent No.: US 9,679,850 B2
(45) Date of Patent: Jun. 13, 2017

(54) METHOD OF FABRICATING SEMICONDUCTOR STRUCTURE

(71) Applicant: TAIWAN SEMICONDUCTOR MANUFACTURING COMPANY LTD., Hsinchu (TW)

(72) Inventors: Wei Ting Chen, Hsinchu (TW); Che-Cheng Chang, New Taipei (TW); Chen-Hsiang Lu, Hsin-Chu (TW); Yu-Cheng Liu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/928,633

(22) Filed: Oct. 30, 2015

(65) Prior Publication Data

US 2017/0125353 A1    May 4, 2017

(51) Int. Cl.
| | |
|---|---|
| *H01L 21/4763* | (2006.01) |
| *H01L 23/532* | (2006.01) |
| *H01L 23/528* | (2006.01) |
| *H01L 23/522* | (2006.01) |
| *H01L 21/768* | (2006.01) |
| *H01L 21/033* | (2006.01) |
| *H01L 21/311* | (2006.01) |

(52) U.S. Cl.
CPC .... *H01L 23/53238* (2013.01); *H01L 21/0332* (2013.01); *H01L 21/31116* (2013.01); *H01L 21/31144* (2013.01); *H01L 21/76804* (2013.01); *H01L 21/76843* (2013.01); *H01L 21/76871* (2013.01); *H01L 21/76877* (2013.01); *H01L 23/528* (2013.01); *H01L 23/5226* (2013.01); *H01L 23/5329* (2013.01)

(58) Field of Classification Search
CPC .................................................. H01L 23/53238
USPC .................................................. 438/240, 689
See application file for complete search history.

(56) References Cited

U.S. PATENT DOCUMENTS

| | | | | |
|---|---|---|---|---|
| 4,801,350 | A * | 1/1989 | Mattox | H01L 21/0337 257/E21.038 |
| 4,871,630 | A * | 10/1989 | Giammarco | H01L 21/0337 216/46 |
| 5,854,119 | A * | 12/1998 | Wu | H01L 21/31116 257/E21.008 |
| 5,882,535 | A * | 3/1999 | Stocks | H01L 21/31116 216/18 |
| 5,895,740 | A * | 4/1999 | Chien | G03F 7/40 216/17 |

(Continued)

*Primary Examiner* — Caleb Henry
(74) *Attorney, Agent, or Firm* — WPAT, P.C., Intellectual Property Attorneys; Anthony King

(57) ABSTRACT

A semiconductor structure having tapered damascene aperture is disclosed. The semiconductor structure including an etching stop layer over an inter-layer dielectric (ILD) layer, a low-k dielectric layer over the etching stop layer, and a tapered aperture at least going into the low-k dielectric layer; wherein the tapered aperture is filled with copper (Cu), a width of a mouth surface portion of the aperture tapers inwardly from a first, wider width to a second, narrower width at a bottom surface portion of the aperture, and the width of the bottom surface portion of the tapered aperture is less than 50 nm. Associated methods of fabricating a semiconductor structure are also disclosed.

20 Claims, 15 Drawing Sheets

(56) References Cited

U.S. PATENT DOCUMENTS

| | | | | |
|---|---|---|---|---|
| 6,365,506 B1* | 4/2002 | Chang | H01L 21/76811 | 257/E21.579 |
| 6,399,486 B1* | 6/2002 | Chen | H01L 21/76882 | 257/E21.175 |
| 7,071,095 B2* | 7/2006 | Huang | H01L 21/2855 | 257/E21.169 |
| 7,259,463 B2* | 8/2007 | Huang | H01L 21/76805 | 257/758 |
| 7,695,632 B2* | 4/2010 | Lee | C23F 4/00 | 216/41 |
| 7,704,886 B2* | 4/2010 | Su | H01L 21/2855 | 257/E21.006 |
| 8,105,949 B2* | 1/2012 | Honda | H01L 21/0212 | 438/694 |
| 8,377,820 B2* | 2/2013 | Werner | H01L 21/0337 | 257/E21.215 |
| 8,592,321 B2* | 11/2013 | Chang | H01L 21/31122 | 257/E21.305 |
| 8,642,483 B2* | 2/2014 | Honda | H01L 21/0212 | 257/E21.214 |
| 8,741,552 B2* | 6/2014 | Chen | G03F 7/0035 | 430/323 |
| 8,883,648 B1* | 11/2014 | Hsieh | H01L 21/76802 | 257/E23.011 |
| 8,927,413 B2* | 1/2015 | Huang | H01L 21/7682 | 257/774 |
| 9,041,216 B2* | 5/2015 | Sung | H01L 23/53295 | 257/758 |
| 9,202,749 B2* | 12/2015 | Ponoth | H01L 21/76843 | |
| 9,330,974 B2* | 5/2016 | Kim | H01L 21/76898 | |
| 9,349,606 B2* | 5/2016 | Cheng | H01L 21/31144 | |
| 2003/0003716 A1* | 1/2003 | Kim | H01L 21/76811 | 438/638 |
| 2006/0024948 A1* | 2/2006 | Oh | H01L 21/76807 | 438/622 |
| 2006/0063373 A1* | 3/2006 | Gambino | H01L 21/76802 | 438/622 |
| 2007/0105362 A1* | 5/2007 | Kim | H01L 21/31144 | 438/618 |
| 2009/0017620 A1* | 1/2009 | Oda | H01L 21/31116 | 438/666 |
| 2009/0131295 A1* | 5/2009 | Cui | H01L 21/02063 | 510/176 |
| 2009/0142931 A1* | 6/2009 | Wang | H01L 21/02063 | 438/734 |
| 2009/0191711 A1* | 7/2009 | Rui | G03F 7/40 | 438/695 |
| 2009/0239375 A1* | 9/2009 | Riess | H01L 21/76808 | 438/640 |
| 2009/0314743 A1* | 12/2009 | Ma | H01L 21/31116 | 216/51 |
| 2010/0178771 A1* | 7/2010 | Oh | H01L 21/31144 | 438/700 |
| 2010/0203733 A1* | 8/2010 | Kanegae | H01L 21/31053 | 438/694 |
| 2010/0301489 A1* | 12/2010 | Seidel | H01L 21/76804 | 257/773 |
| 2010/0317195 A1* | 12/2010 | Feng | H01L 21/31116 | 438/702 |
| 2011/0256715 A1* | 10/2011 | Pan | H01L 21/76831 | 438/653 |
| 2012/0244710 A1* | 9/2012 | Chumakov | H01L 21/0337 | 438/701 |
| 2013/0302989 A1* | 11/2013 | Kenny | H01L 21/76816 | 438/700 |
| 2014/0061913 A1* | 3/2014 | Yeh | H01L 21/76858 | 257/751 |
| 2014/0131883 A1* | 5/2014 | Huang | H01L 21/7682 | 257/774 |
| 2015/0091172 A1* | 4/2015 | Ko | H01L 23/53295 | 257/741 |
| 2015/0179472 A1* | 6/2015 | Cheng | H01L 21/31116 | 438/675 |

* cited by examiner

METHOD OF FABRICATING SEMICONDUCTOR STRUCTURE

BACKGROUND

In integrated circuit design, a commonly used method for forming metal lines and vias is known as "damascene." Generally, this method involves forming an opening in a dielectric layer, which separates the vertically spaced metallization layers. The opening is typically formed using conventional lithographic and etching techniques. After the formation, the opening is filled with copper or copper alloys. Excess copper on the surface of the dielectric layer is then removed by a chemical mechanical polish (CMP). The remaining copper or copper alloy forms vias and/or metal lines.

The metallization layers interconnecting individual devices typically comprise an inter-metal dielectric (IMD) layer in which interconnect structures, such as vias and conductive lines, are formed, through numerous and repetitive steps of deposition, patterning and etching of thin films on the surface of silicon wafers. While aluminum and aluminum alloys were most frequently used in the past for the metallization layers, the current trend is to use copper (Cu) for metallization layers because copper has better electrical characteristics than aluminum, such as decreased resistance, higher conductivity, and a higher melting point.

Nowadays, copper is commonly used in the damascene structures because of its low resistivity. Typically, copper is electro-plated into damascene openings. As is well known in the art, in order to plate copper, a seed layer is required to provide a low-resistance electrical path, and hence to enable uniform electro-plating over the wafer surface, so that copper ions in the plating solution can be deposited.

In most cases, prior art method for anisotropic trench etching and dual damascene formation has attempted to achieve substantially vertical sidewall profiles. After a copper seed layer is formed over sidewalls and a bottom of trench, a necking effect may occur due to the fact that on the sidewalls of trench, top portions of the seed layer are thicker than bottom portions, resulting in overhangs. Such overhang formations further constrict the opening dimension of the trench at the mouth portion thereof and consequently increases the likelihood of a "pinch-off" or "necking effect" and an attendant void formation. Inevitably, with the continual reductions in minimum feature sizes, the necking effect in a profile of seed layer will adversely affect the quality of the subsequently performed electro-plating.

Therefore, a novel mechanism to mitigate the aforementioned issues during a damascene operation has become an urgent need in fields pertinent to semiconductor manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
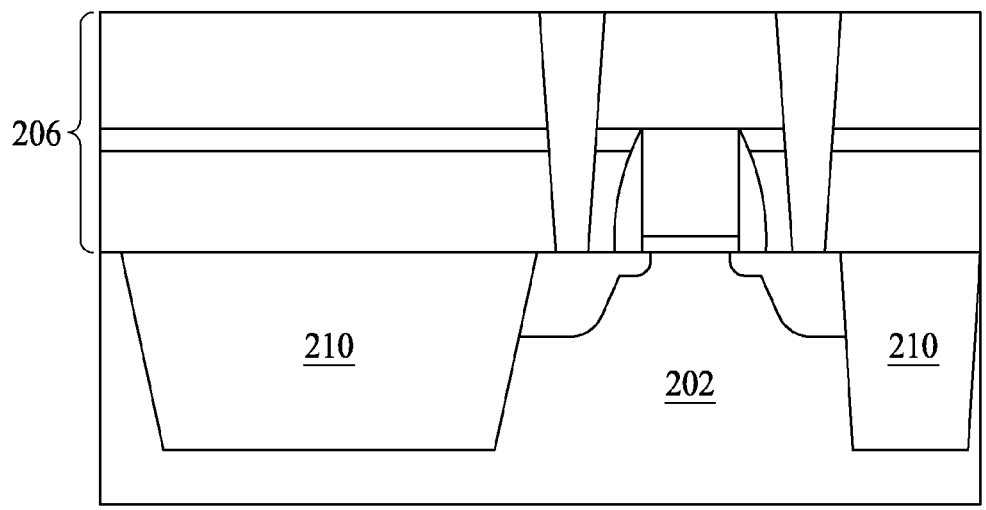
FIG. 1 illustrates a cross-sectional view of an FEOL stage in the formation of a semiconductor structure according to an embodiment of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Generally, integrated circuits (ICs) includes individual devices, such as transistors, capacitors, or the like, formed on a substrate. One or more metallization layers are then formed over the individual devices to provide connections between the individual devices and to provide connections to external devices. The front-end-of-line (FEOL) is the first portion of IC fabrication where the individual devices (transistors, capacitors, resistors, etc.) are patterned in a wafer. A FEOL generally covers everything up to (but not including) the deposition of metallization layers. The back end of line (BEOL), a.k.a. damascene operation, is the second portion of IC fabrication where the individual devices get interconnected with wiring or metallization layers on the wafer.

The present disclosure provides a damascene aperture having tapered cross-sectional profile and an associated method. A width of a mouth surface portion of the damascene aperture tapers inwardly from a first, wider width to a second, narrower width at a bottom surface portion of the aperture, and the width of the bottom surface portion of the tapered aperture is less than a specific dimension, e.g. 50 nm. The damascene aperture includes via or trench. By intentionally controlling the shape of said openings, the necking effect will be remarkably mitigated, especially for openings in minimum feature sizes. As a result, the quality of the subsequently performed electro plating can be improved. The recipe of the electro plating, for example, may have an increased bombardment capability. Greater details regarding the disclosure are described as follows.

FIG. 1 illustrates a cross-sectional view of an FEOL stage in the formation of a semiconductor structure according to an embodiment of the present disclosure. The semiconductor structure of FIG. 1 includes individual devices, such as transistors, formed on a bottom layer 202. The bottom layer 202 is a substrate layer where a plurality of drain and source regions of the transistors may be formed. The substrate layer 202 may include, for example, bulk silicon, doped or undoped, or an active layer of a semiconductor-on-insulator (SOI) substrate. Generally, an SOI substrate includes a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

Transistors may include a gate structure 205 and the gate structure 205 can be a planar or three dimension (such as FinFET) gate. Various materials can be chosen for the gate structure 205, such as metal, poly, or metal alloy.

In some embodiments, the bottom layer 202 may include p-type and/or n-type doped regions of electrical devices such as N-type metal-oxide semiconductor (NMOS) devices and/or P-type metal-oxide semiconductor (PMOS) devices. The N/P-type devices may include transistors, capacitors, resistors, diodes, photo-diodes, fuses, and the like, interconnected to perform one or more functions. The functions may include memory structures, processing structures, sensors, amplifiers, power distribution, input/output circuitry, or the like.

Shallow trench isolations (STIs) 210, or other isolation structures, may be formed in the bottom layer 202 to isolate device regions. STIs 210 may be formed by etching the bottom layer 202 by using photolithography techniques to form recesses. Generally, photolithography involves depositing a photoresist material, which is then masked, exposed, and developed. After the photoresist mask is patterned, an etching process may be performed to remove unwanted portions of the bottom layer 202. In an embodiment in which the substrate includes bulk silicon, the etching process may be a wet or dry, anisotropic or isotropic, etching process. The recesses are then filled with a dielectric material such as an oxide layer formed by any oxidation process, such as wet or dry thermal oxidation in an ambient environment comprising an oxide, H2O, NO, or a combination thereof, or by chemical vapor deposition (CVD) techniques using tetraethyl-ortho-silicate (TEOS) and oxygen as a precursor. A planarization step may be performed to planarize the surface of the isolation material with a top surface of the bottom layer 202. The planarization step may be accomplished, for example, using a chemical mechanical polishing (CMP) process known and used in the art.

An insulating layer, i.e., an inter-layer dielectric (ILD) layer 206, is formed over the bottom layer 202. The ILD layer 206 may include a low dielectric constant (k value less than about 3.0) material or an extra low dielectric constant (k value less than about 2.5) material. For example, the ILD layer 206 may include an oxide, SiO2, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PE-TEOS). A planarization process, such as chemical-mechanical polishing (CMP), may be performed to planarize the ILD layer 206.

The process forming the individual devices such as transistors, capacitors, resistors, diodes, photo-diodes, fuses, STIs, and the like, within the bottom layer 202 and the ILD layer 206 may be collectively referred to as the FEOL process, which is the first portion of IC fabrication where the individual devices (transistors, capacitors, resistors, etc.) are patterned in a wafer. FEOL generally covers everything up to (but not including) the deposition of metallization layers.

Following the FEOL process is the back end of line (BEOL) process, which is the second portion of IC fabrication where the individual devices are interconnected with wiring or metallization layers on the IC.

Figure 2:
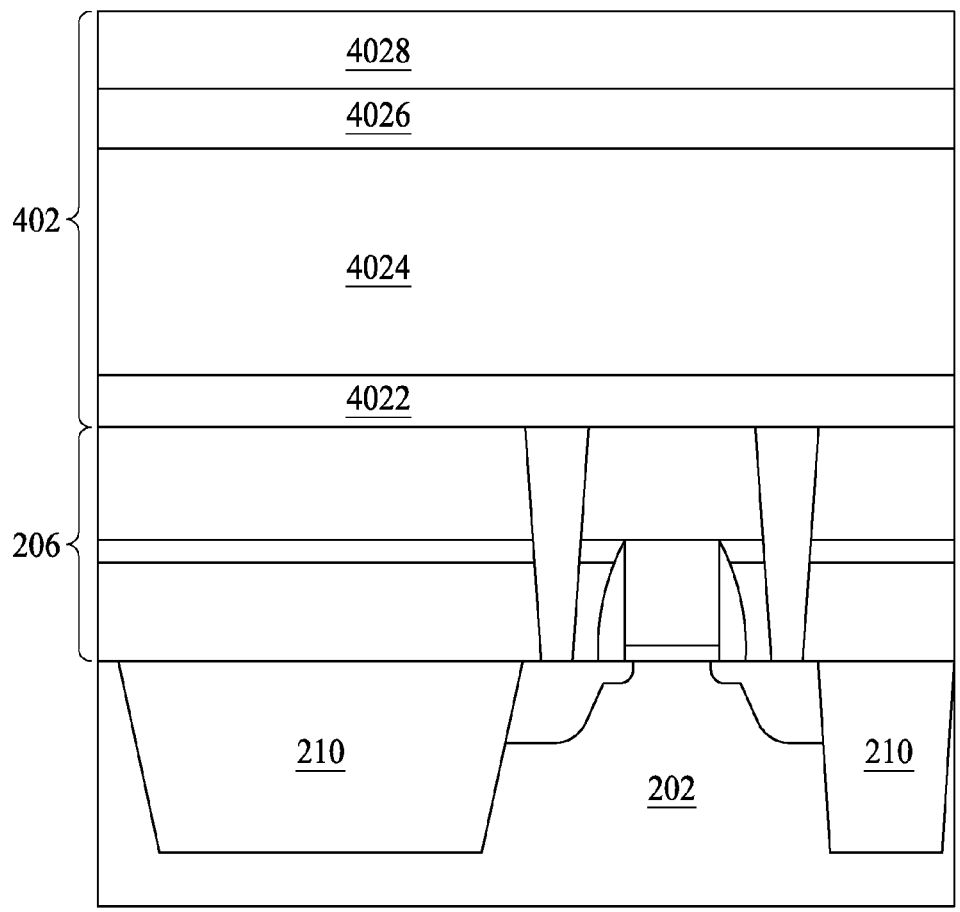
FIGS. 2-9 illustrate cross-sectional views including the BEOL stage subsequent to FIG. 1 in the formation of a semiconductor structure according to an embodiment of the present disclosure.

FIG. 2 illustrates a cross-sectional view including the BEOL stage subsequent to FIG. 1 in the formation of a semiconductor structure according to an embodiment of the present disclosure. An exemplary IMD layer 402 shown in FIG. 2 may include a low dielectric constant (k value) material or an extra low dielectric constant (ELK) material. Generally, a low-k dielectric material has a dielectric constant of less than about 3.5, and an ELK dielectric material has a dielectric constant of less than about 2.8. The ELK material includes, for instance, carbon-doped silicon dioxide and porous silicon dioxide. A planarization process, such as chemical-mechanical polishing (CMP), may be performed to planarize the IMD layer 402.

The IMD layer 402 can be a composite film as illustrated in FIG. 2 Several layers such as the layers 4022, 4024, 4026 and 4028 of similar or different materials are stacked on the ILD layer 206. Those layers 4022, 4024, 4026 and 4028 may be parts of the IMD layer 402 and they are deposited by methods including chemical vapor deposition (CVD), plasma enhanced chemical vapor deposition (PECVD), high density plasma chemical vapor deposition (HDP-CVD) and atmospheric pressure chemical vapor deposition (APCVD).

As illustrated in FIG. 2, an etching stop layer 4022 may be formed on the ILD layer 206. In addition to signaling the termination point of an etching process, the etching stop layer 4022 protects any underlying layer during the etching process. The etching stop layer 4022 may include a plurality of layers. Materials for the etching stop layer 4022 may include SiC, SIN, TEOS, hard black diamond (HBD), or the like. Alternatively, the etching stop layer 4022 may be formed by depositing and annealing a metal oxide material, which may include hafnium, hafnium oxide ($HfO2$), or aluminum.

A low-k or extra low-k (ELK) dielectric layer 4024 may be formed on the etching stop layer 4022. The low-k or ELK dielectric layer 4024 may include commonly used materials such as fluorinated silicate glass (FSG), carbon-containing dielectric materials, and may further contain nitrogen, hydrogen, oxygen, and combinations thereof. A porous structure may exist in the low-k or ELK dielectric layer 4024 for lowering its k value. The low-k or ELK dielectric material may include a SiOC-based spin-on material that can be applied to or deposited by a spin-on method, such as spin coating. Alternatively, the low-k or ELK dielectric material may be deposited by a chemical vapor deposition (CVD).

A nitrogen free anti-reflection layer (NFARL) 4026, which may be called anti-reflective coating (ARC), may be formed on the low-k or ELK dielectric layer 4024. Forming damascene structures requires the use of lithographic processes. Many of the underlying material layers may comprise energy sensitive resist materials which are reflective to ultraviolet light used in the lithographic processes. These reflections can distort the dimensions of features such as lines and vias that are formed in the energy sensitive material. An ARC or anti-reflection layer (ARL) may be used to minimize reflections from an underlying material layer. The ARC suppresses the reflections of the underlying material layer during resist imaging, providing accurate pattern replication in the layer of an energy sensitive resist. Conventional ARC materials may contain nitrogen, including silicon nitride and titanium nitride. Nitrogen in the ARC layer may chemically alter the composition of the photoresist material. The chemical reaction between nitrogen and the photoresist material is referred to as photoresist poisoning. The altered photoresist material may not be lithographically patterned as expected, resulting in imprecisely formed features in the photoresist material, which can detrimentally affect subsequent processes such as etching processes. Therefore the NFARL 4026 is used as the preferred layer over the low-k dielectric or ELK layer 4024.

A metal-hard-mask (MHM) layer 4028 may be optionally formed on the NFARL layer 4026. The MHM layer 4028 may include TiN material. The MHM layer 4028 may include another material such as Ti, Ta, W, TaN or WN.

Figure 3:
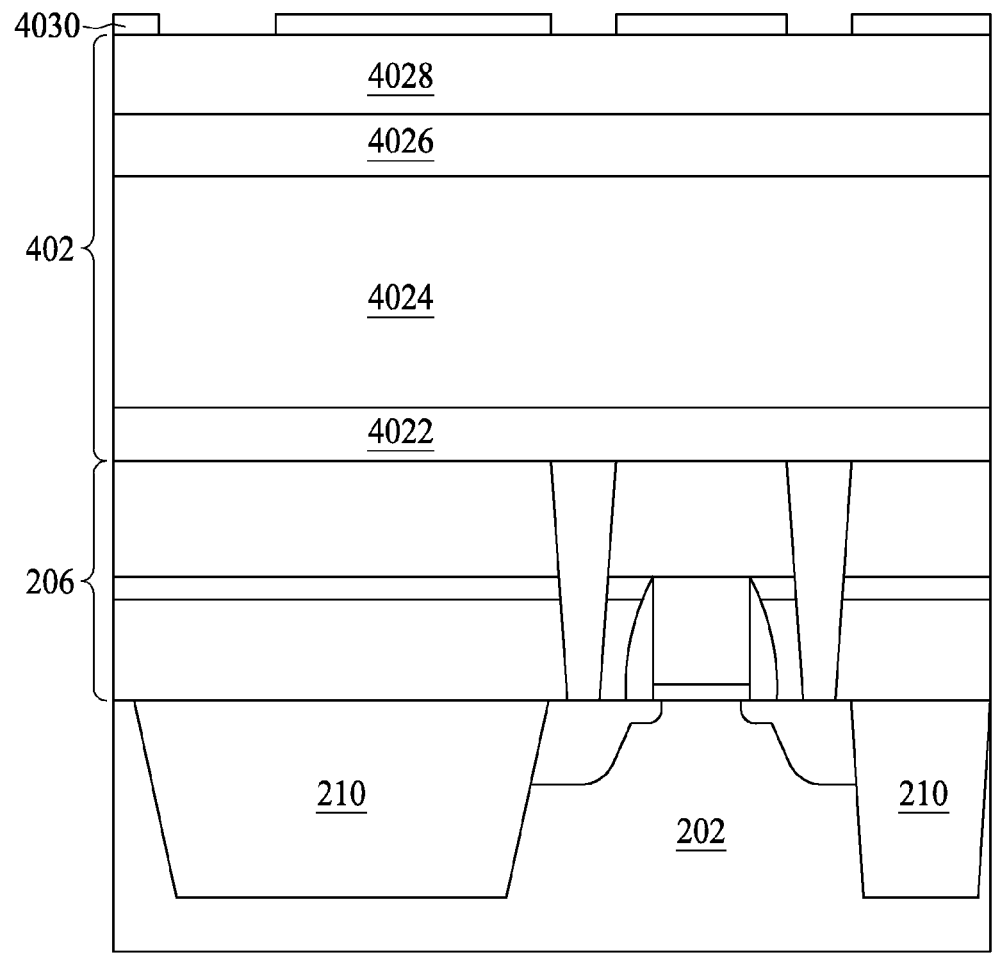

FIG. 3 illustrates a cross-sectional view of the BEOL stage subsequent to FIG. 2 in the formation of a semiconductor structure according to an embodiment of the present disclosure. A photoresist layer 4030 may be defined on the MHM layer 4028. The photoresist layer 4030 required to be patterned based on the desired layout configuration of vias and trenches, as shown in FIG. 3. In this way, vias and trenches can be etched in accordance with patterns of the photoresist layer 4030 when the damascene operation moves to the subsequent step. The photoresist layer 4030 may include adhesive agents, sensitizers and solvents. It may be a positive or a negative resist. The photoresist layer 4030 may be formed by spin on methods on a rotating chuck.

Figure 4:
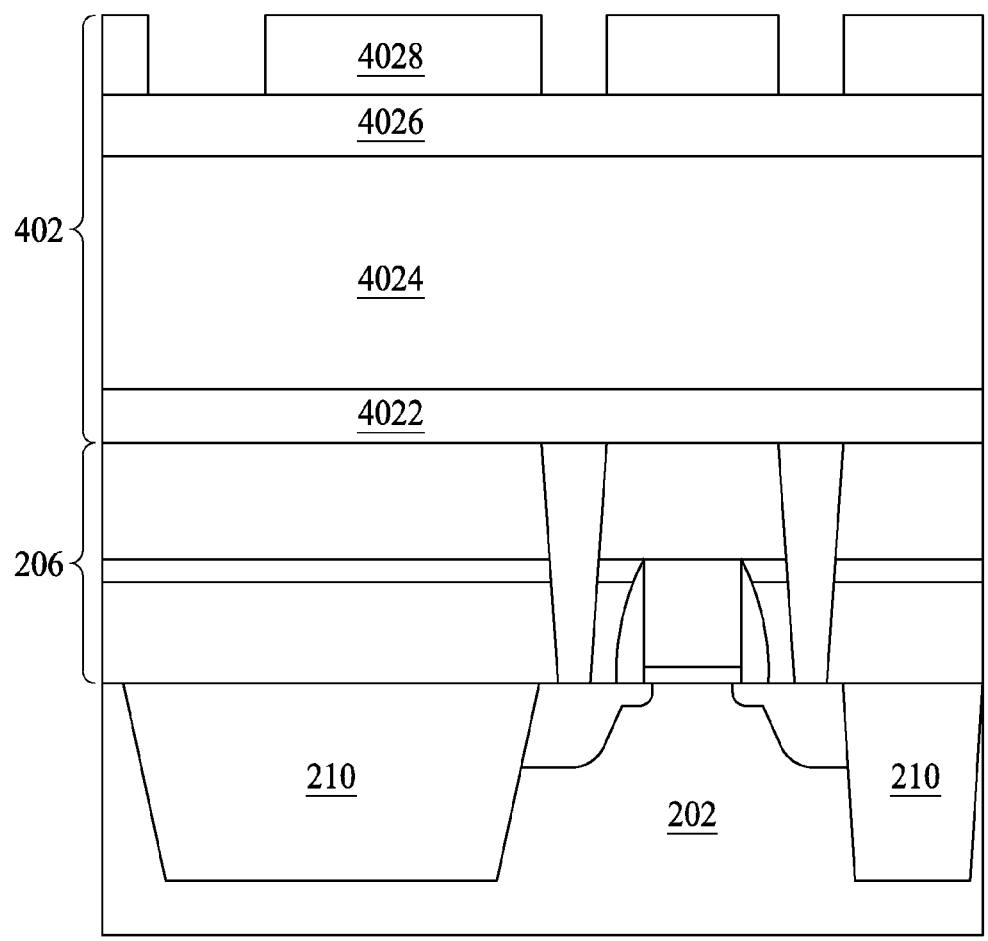
Figure 5:
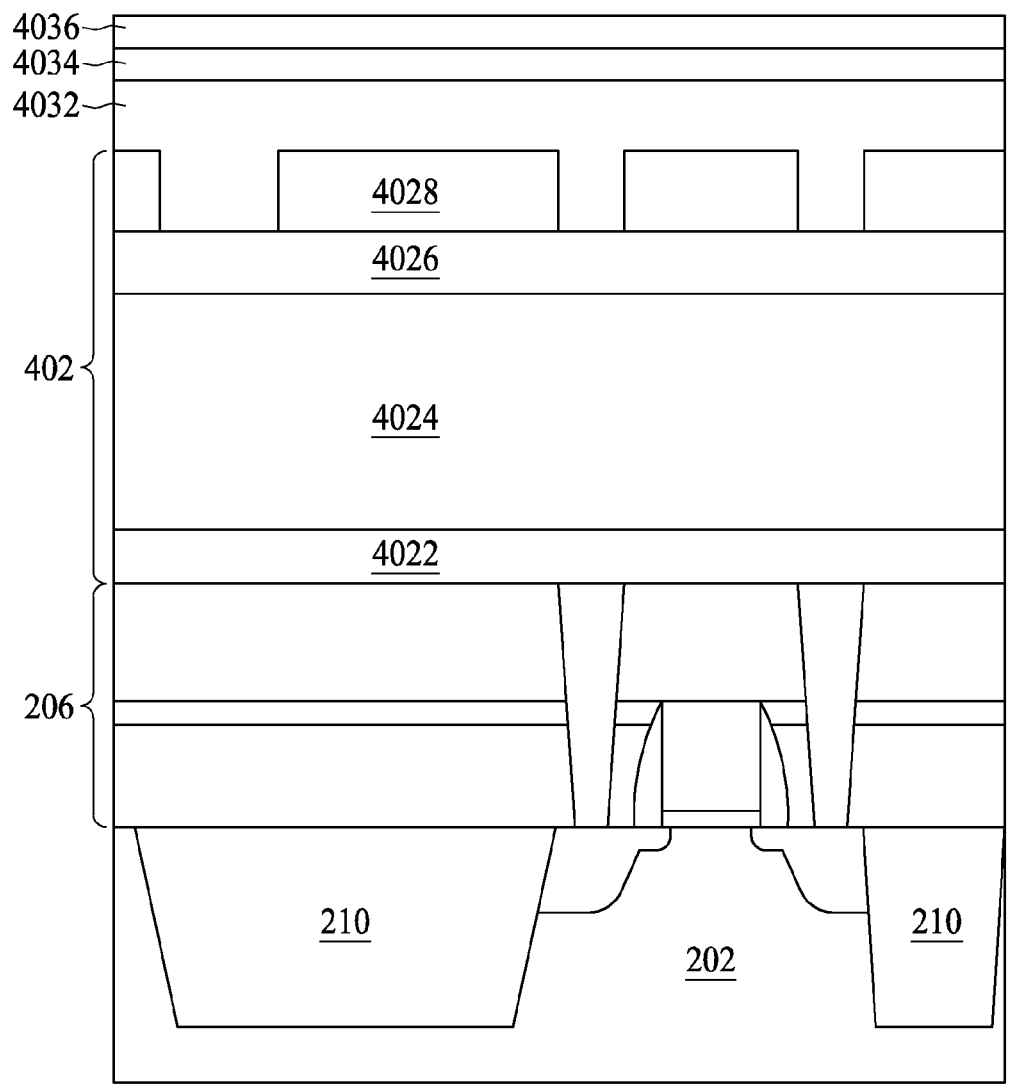
Figure 6:
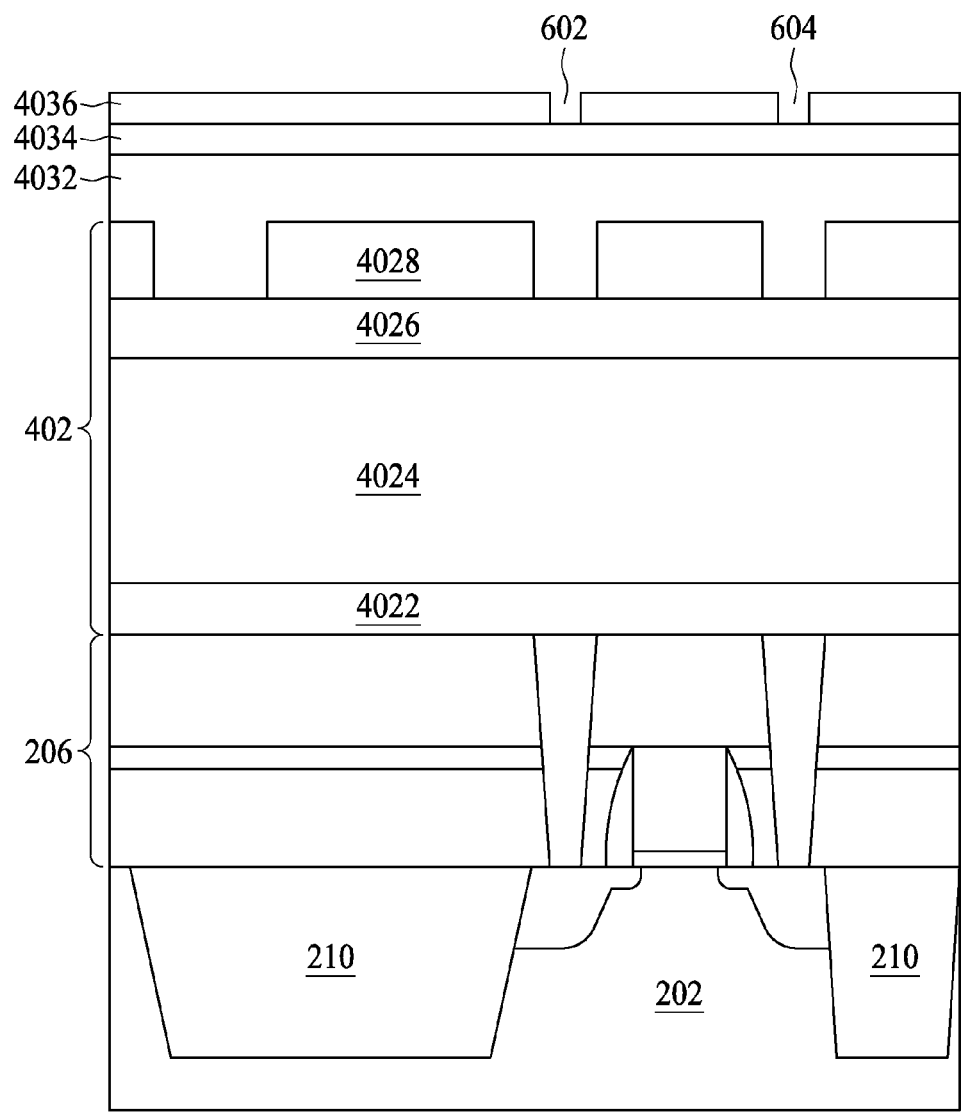

The photoresist layer 4030 is transferred into the MHM layer 4028 by an etching process. Said etching process is preferably selective to ensure that the NFARL 4026 will remain intact during any overetching of the MHM layer 4028. Thereafter, the photoresist layer 4030 is removed by a process such as wet chemical etching to form the structure of FIG. 4. In this embodiment, a composite layer of photoresist is deposited in FIG. 5. The composite layer of photoresist includes a first layer 4032, a second layer 4034 and a third layer 4036 as shown in FIG. 5. In FIG. 6, two trench openings 602 and 604 that are shown in FIG. 6 are formed in the composite layer of photoresist. The trench openings penetrate through the first layer 4036 down to expose the second layer 4034.

Figure 7:
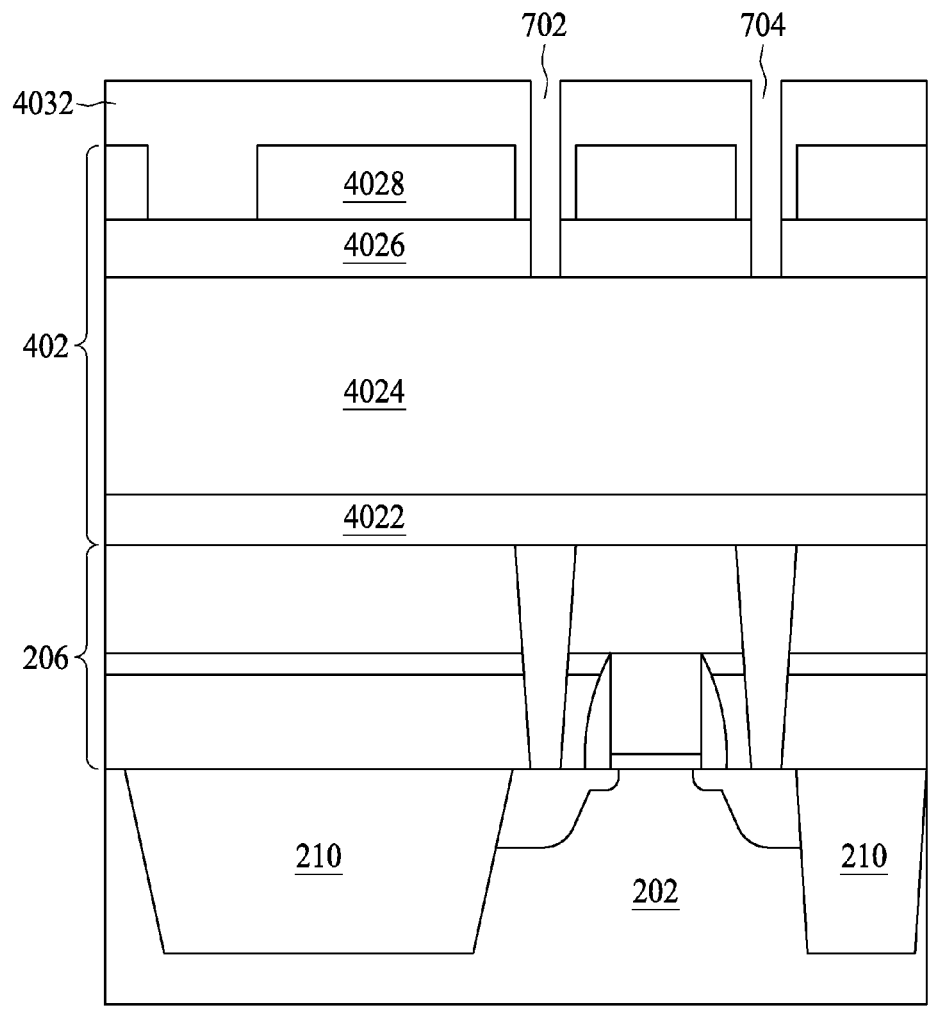

The trench openings 602 and 604 are then processed under a condition of a pressure range of about 1 mtorr-150 mtorr; a temperature range of about 10-70 degree C.; an etching bias power having a range of about 100 W-1500 W. The etch recipe may also include a plasma etching gas having $CF_4$, $H_2$, $N_2$, $C_4F_8$ (octafluorocyclobutane), $O_2$, and $CH_2F_2$. As can be seen in FIG. 7, the trench openings 602 and 604 are transformed into trenches 702 and 704, and the second and third layers 4034 and 4036 are removed concurrently during the same operation. Trenches 702 and 704 are formed to expose dielectric layer 4024. Please note that each of the trenches 702 and 704 has a diameter narrower than that of the openings formed in the MHM layer 4028 of FIG. 4.

The remaining first layer 4032 is then exposed to an ambient of a pressure range of about 1 mtorr-150 mtorr; a temperature range of about 10-70 degree C.; an etching bias power having a range of about 100 W-1000 W. The etch recipe may also include a plasma etching gas having $CO_2$, $C_4H_8$, $CF_4$, $O_2$, $N_2$, and Ar. After the first layer 4032 is removed, as illustrated in FIG. 8, the etch recipe may be adjusted to include a plasma etching gas having $C_4H_8$, $CF_4$, $O_2$, $N_2$, and Ar to obtain the desired structure of FIG. 9.

Figure 8:
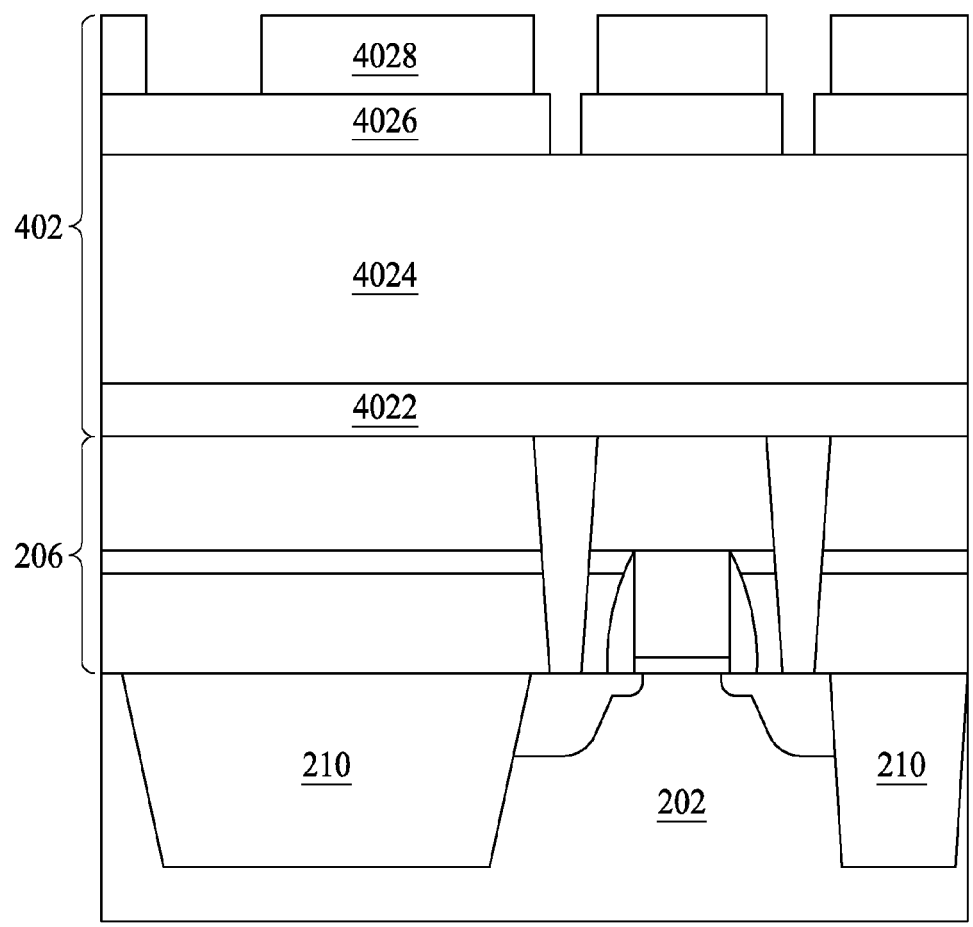
Figure 9:
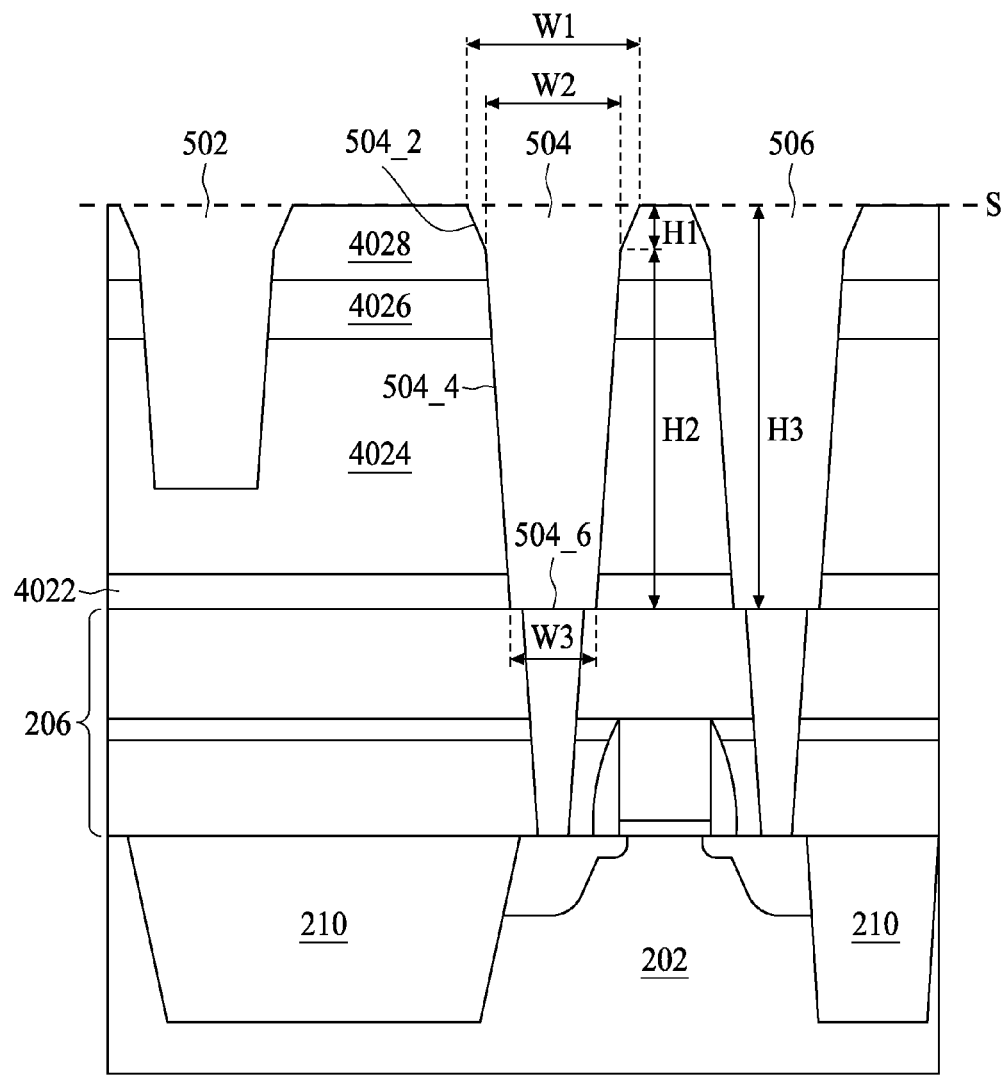

FIG. 9 illustrates a cross-sectional view of the BEOL stage subsequent to FIG. 8 in the formation of a semiconductor structure according to an embodiment of the present disclosure. Portions of the IMD layer 402 are etched away to form recessed features, such as trenches and vias, which can connect different regions of the IC and accommodate the conductive lines. A damascene process which creates either only trenches or vias is known as a single damascene process. A damascene process which creates both trenches and vias at the same time is known as a dual-damascene process. Damascene and dual-damascene processes use lower resistance metals such as copper to form many metal elements (e.g. lines, interconnects, and the like) instead of the conventionally used aluminum.

Interconnections between different metallization layers are made by vias. Vias go through the insulating IMD layer 402 separating different metallization layers, and allow for communication between interconnects of other metallization layers or directly with the semiconductor devices in the bottom layer 202.

As illustrated in FIG. 9, a single or dual-damascene process may be employed to create vias and conductive lines of a higher metallization layer. The dual-damascene process may be the via first trench last (VFTL) approach or the trench first via last (TFVL) approach. The layers, including layers 4028, 4026, 4024 and 4022, are etched to create via openings, or via holes, and trenches for conduction paths. A high-aspect ratio trench 502 and high-aspect ratio via openings 504 and 506 are shown in FIG. 9. As employed herein, the term "high aspect ratio" recess refers to an opening having a depth-to-width ratio of at least 2:1, and up to and including a ratio of about 5:1.

The concept of the present disclosure is for solving emerging issues when critical dimensions (CD) of vias or trenches to be formed in the metallization layer become smaller. In physical vapor deposition (PVD), CVD processes, or atomic layer deposition (ALD), barrier or copper seed layer may preferentially deposit near the top corners of vias or trenches, particular vias or trenches with high depth-to-width aspect ratios, leading to a "bottleneck" shape, i.e. necking effect. Further plating of metal onto the bottleneck may result in sealing the top of the vias or trenches before completely filling the vias or trenches with metal, thus creating a void. Voids increase the resistance of the conductor over its designed value due to the absence of a planned-for conductor. Also, trapped electrolytes in sealed voids may corrode the metal. This may lead to degraded device performance or device failure in extreme cases. In order to mitigate the aforementioned issue, the trench 502 and via openings 504, 506 shown in FIG. 9 are intentionally configured to have a tapered profile with a rounded top corner edge. In this embodiment, the rounded top corners and the tapered trenches or vias are in situ formed in the IMD layer 402.

In FIG. 9, the trench 506 and via openings 502, 504 formed in the layers 4028, 4026, 4024 and 4022 atop the ILD layer 206 includes, for purposes of the following discussion, a mouth surface portion, an interior wall surface portion, and a bottom surface portion. For example, the via hole 504 has a mouth surface portion 504_2 which is at the upper end around the top corner, a bottom surface portion 504_6 which is at the lower end, and an interior wall surface portion 504_4 which is at the middle of the mouth surface portion 504_2 and the bottom surface portion 504_6. As illustrated, the width of the mouth surface portion 504_2 tapers inwardly from a first, wider width W1 at the non-recessed surface S to a second, narrower width W2 at a first depth H1 below the surface S by a first slope in order to form a rounded top corner. The width of the interior wall surface portion 504_4 tapers inwardly from the second width W2 at the first depth H1 below the surface S to a third, narrower width W3 at a bottom surface 504_6, which is located at a second depth H2 below the first depth H1, by a second slope such that the total depth H3=H1+H2. By way of illustration, but not limitation, for a typical recess or opening such as a via hole or trench for interconnection routing in high-density semiconductor devices as contemplated for use herein, the width W3 at the bottom end portion 504_6 is less than about 50 nm, which is less than the width W1 of the mouth surface portion 504_2 and the width W2 of the interior wall surface portion 504_4. The total depth H3 is about 1000-3000 Å below the surface S. However, this is not a limitation of the disclosure.

Figure 10:
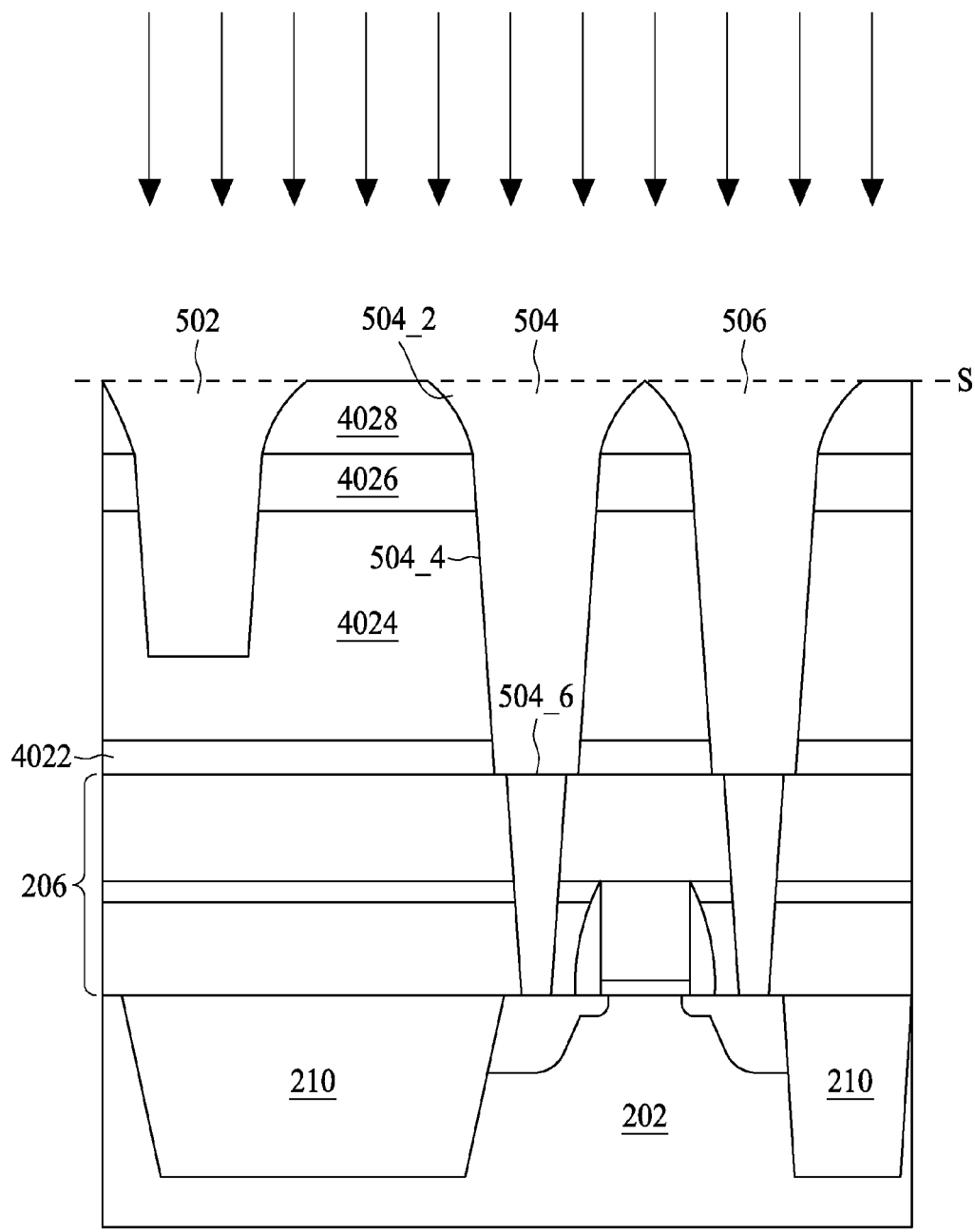
FIG. 10 illustrates a cross-sectional view of the BEOL stage according to a second embodiment of the present disclosure.
Figure 11:
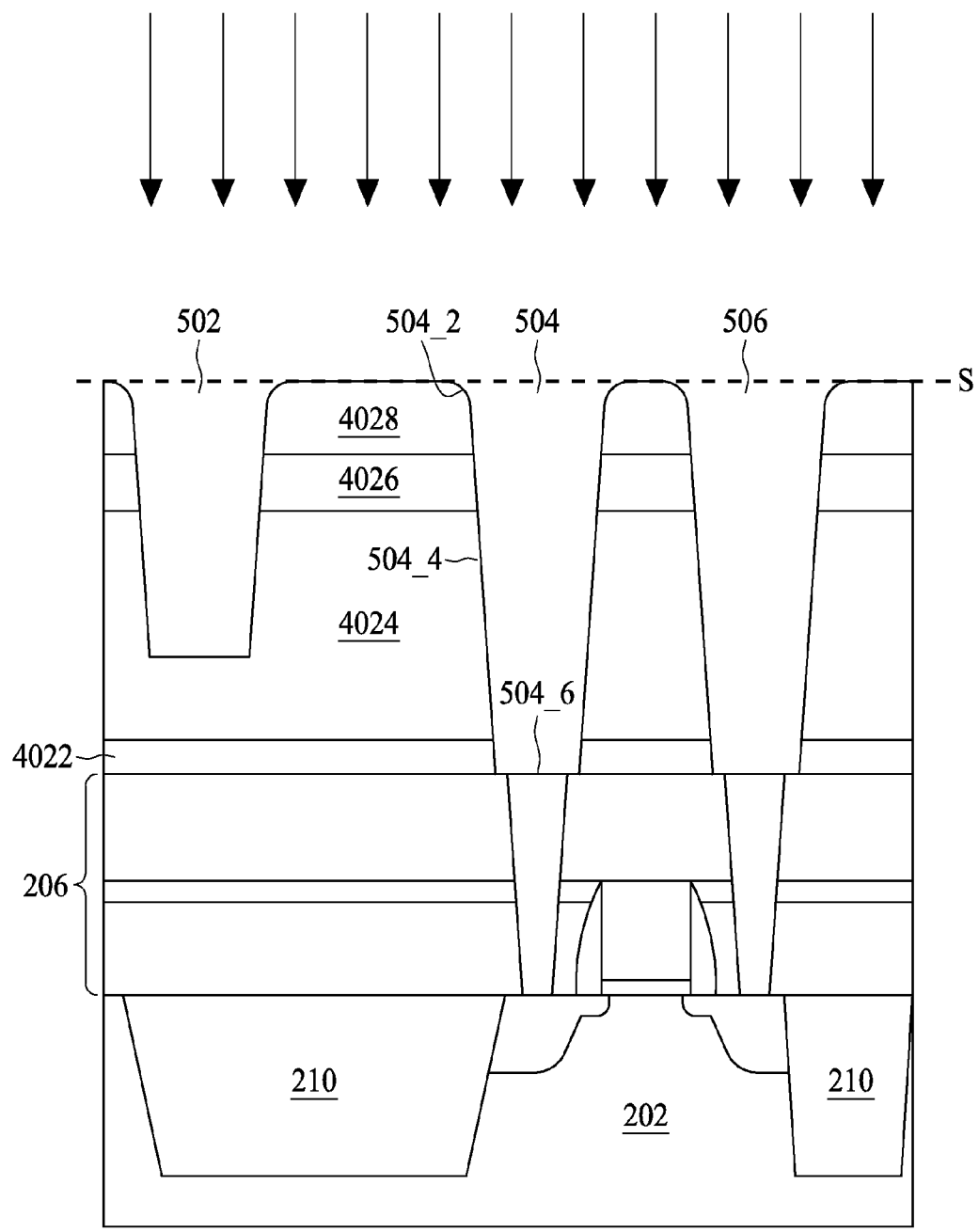
FIG. 11 illustrates a cross-sectional view of the BEOL stage according to a third embodiment of the present disclosure.

In some embodiments, the width of the mouth surface portion 504_2 tapers inwardly from the first, wider width W1 at the non-recessed surface S to the second, narrower width W2 at the first depth H1 below the surface S by a varied slope. For example, in another embodiment, the mouth surface portion 504_2 of the via hole may have a geometric polygonal shape seen from the cross-sectional view as shown in FIG. 10. For another example, in still another embodiment, the mouth surface portion 504_2 of the via hole may have a continuous curved shape seen from the cross-sectional view as shown in FIG. 11. Please note that the present disclosure is not limited to above mentioned geometric shapes. Similar profiles that substantially round the top corner also fall within the contemplated scope of the present disclosure.

Figure 12:
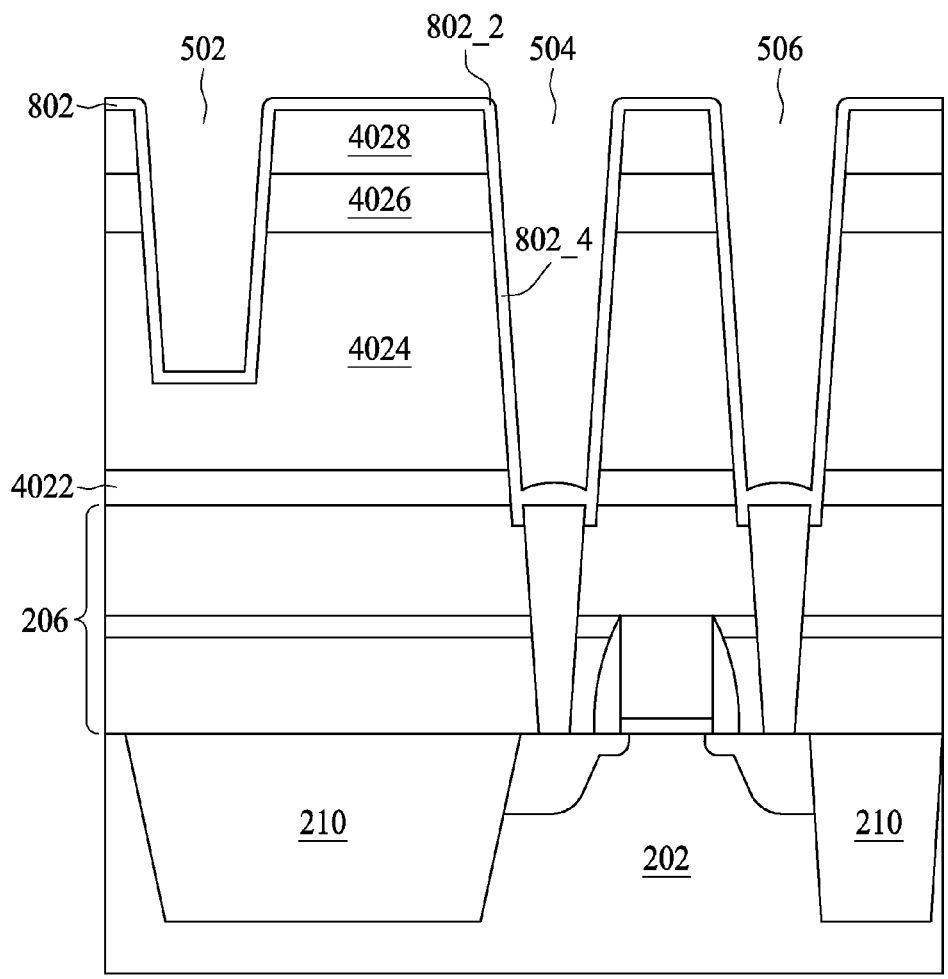
FIG. 12 illustrates a cross-sectional view of the BEOL stage subsequent to FIG. 9 in the formation of a semiconductor structure according to an embodiment of the present disclosure.

FIG. 12 illustrates a cross-sectional view of the BEOL stage subsequent to FIG. 9 in the formation of a semiconductor structure according to an embodiment of the present disclosure. As illustrated in FIG. 12, a thin barrier layer 802 may be deposited covering the sidewalls and a bottom of the trench 502 and via openings 504 and 506. The barrier layer 802 may be formed using a process such as chemical vapor deposition (CVD), physical vapor deposition (PVD), plasma enhanced CVD (PECVD), plasma enhanced physical vapor deposition (PEPVD), atomic layer deposition (ALD), combinations of these, or the like. The barrier layer 802 may include tantalum nitride, although other materials, such as tantalum, titanium, titanium nitride, combinations of these, and the like may alternatively be used. The barrier film 802 is used to prevent copper diffusion in the dielectric. It can be seen that a thickness of portions 802_2 of the barrier layer 802 is typically greater than a thickness of portions 802_4 of the barrier layer 802. The excess portions 802_2 hanging beyond the portions 802_4 are often referred to as overhangs. In this embodiment, by enlarging the top opening and forming the tapered profile, the subsequent copper filling operation is not greatly affected by the necking effect induced from overhangs formed around the top corners of the trench 502 and via openings 504, 506. Thus, the issue of unwanted gaps or voids can be mitigated.

Figure 13:
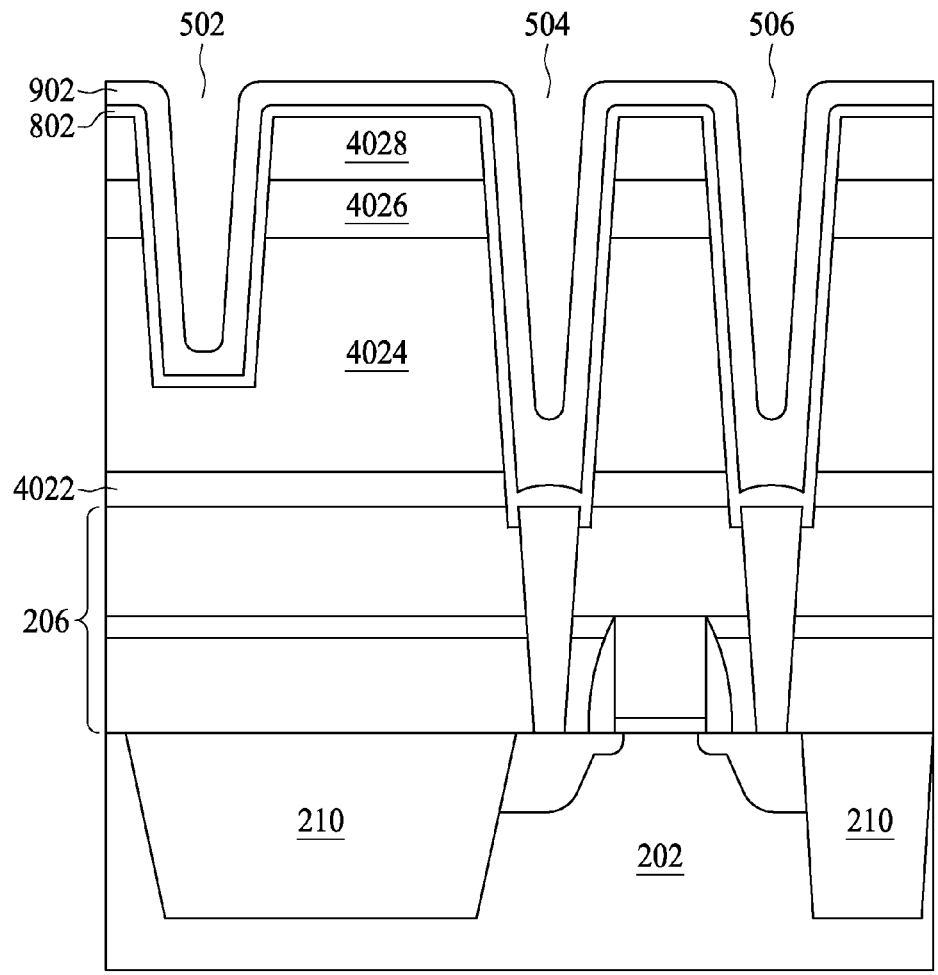
FIG. 13 illustrates a cross-sectional view of the BEOL stage subsequent to FIG. 12 in the formation of a semiconductor structure according to an embodiment of the present disclosure.

FIG. 13 illustrates a cross-sectional view of the BEOL stage subsequent to FIG. 12 in the formation of a semiconductor structure according to an embodiment of the present disclosure. A seed layer 902 may be formed on the barrier layer 802 to improve the quality of the electrode surface such that high quality plating may be obtained for the copper or copper alloy to be deposited in the next step. In an exemplary deposition process, argon is first introduced to generate argon plasma. The positively charged argon ions are attracted to the negatively charged copper or copper alloy material, causing a bombardment. Copper ions are thus sputtered from the copper or copper alloy material, and deposited onto the barrier layer 802, forming the seed layer 902. The seed layer 902 is a thin copper layer on the surface on which a metal layer will be plated. The chemical vapor deposition (CVD) may be used to deposit the seed layer 902. Optionally, before the formation of the seed layer 902, the barrier layer 802 is pre-cleaned. The pre-cleaning greatly improves the surface texture of the barrier layer 802 so that the subsequently formed seed layer 902 may be more conformal.

Figure 14:
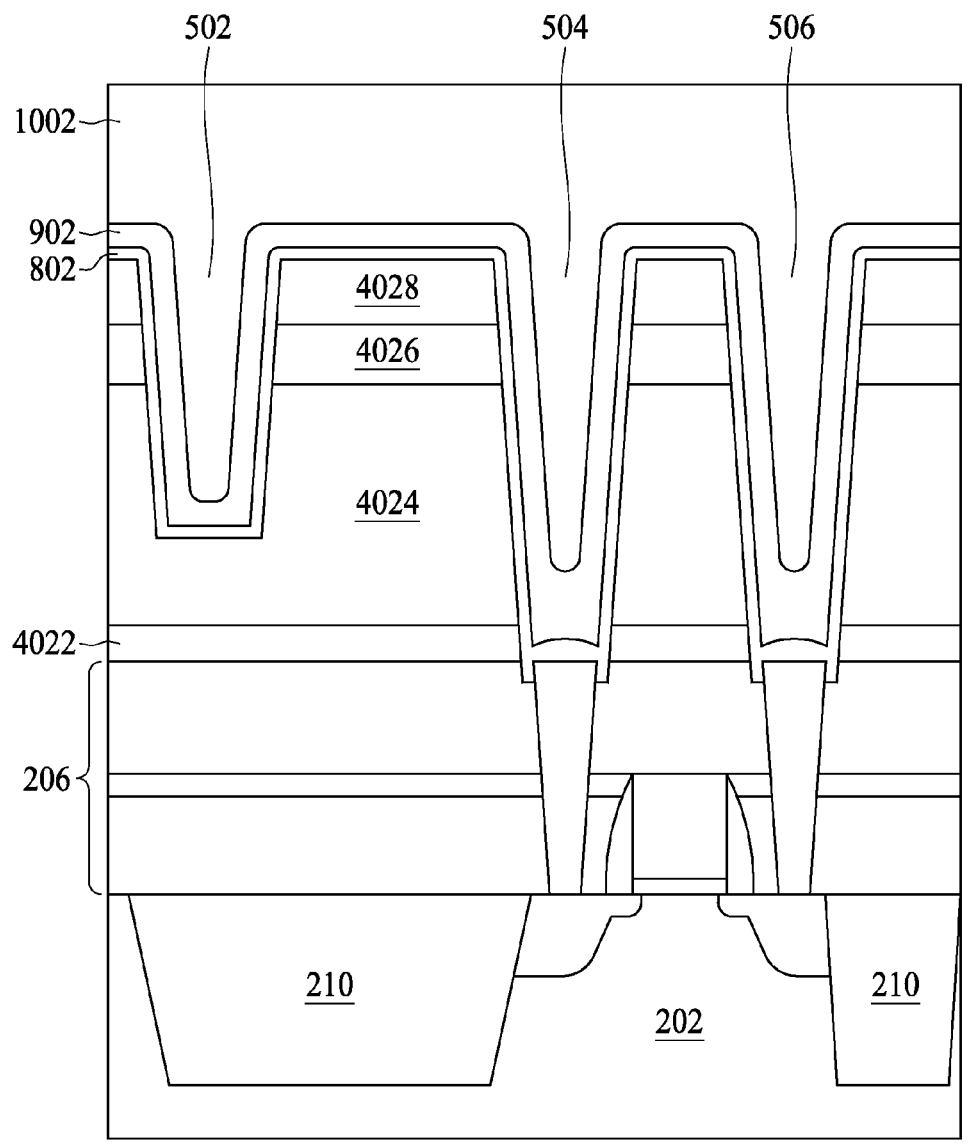
FIG. 14 illustrates a cross-sectional view of the BEOL stage subsequent to FIG. 13 in the formation of a semiconductor structure according to an embodiment of the present disclosure.
Figure 15:
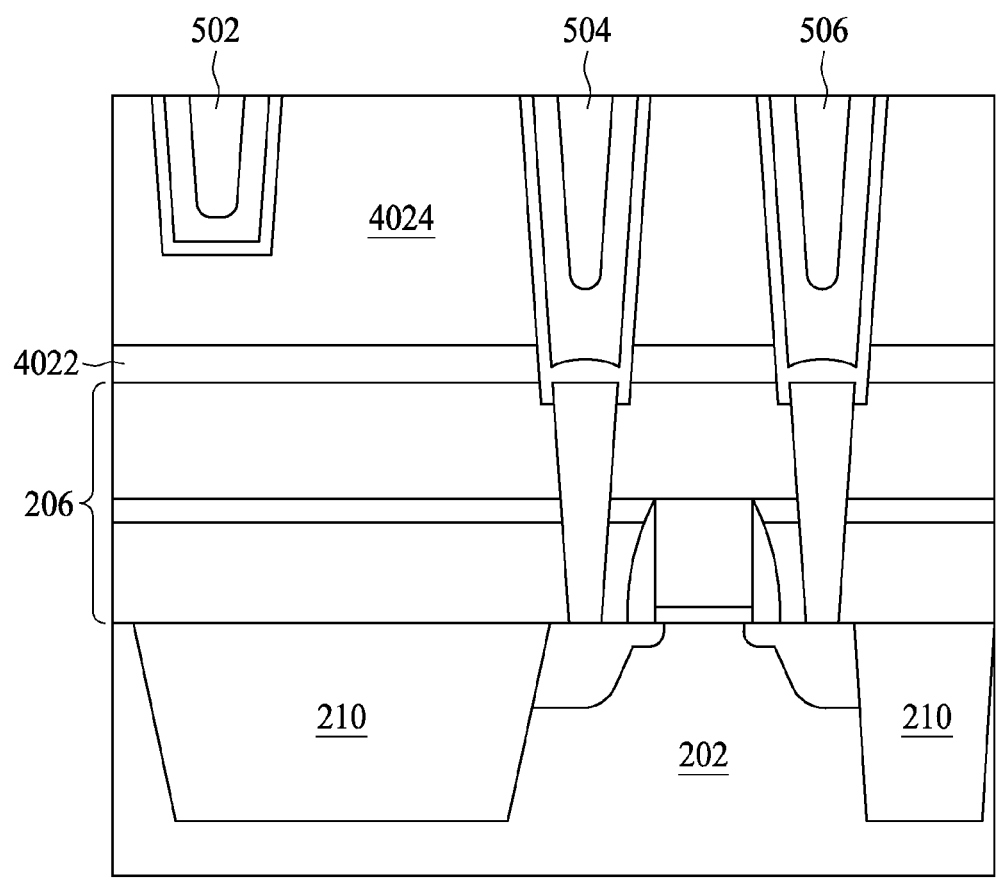
FIG. 15 illustrates a cross-sectional view of the BEOL stage subsequent to FIG. 14 in the formation of a semiconductor structure according to an embodiment of the present disclosure.

FIG. 14 illustrates a cross-sectional view of the BEOL stage subsequent to FIG. 13 in the formation of a semiconductor structure according to an embodiment of the present disclosure. A conductive material 1002, such as copper, may be disposed over the seed layer 902, into the openings 502, 504 and 506, to form the vias and the conductive lines. The conductive material 1002 may be formed by an electrochemical plating process. FIG. 15 illustrates a cross-sectional view of the BEOL stage subsequent to FIG. 14 in the formation of a semiconductor structure according to an embodiment of the present disclosure. A planarization process, such as a chemical mechanical polishing (CMP) process, may be performed towards the bottom layer 202 to expose the low-k or ELK dielectric layer 4024.

The above mentioned methods for forming the semiconductor structure shown in FIGS. 9-11 is preferably applied to an N20 technology node (20 nm process) and beyond because necking or narrowing of the via opening is more severe in high aspect ratio vias. Such necking or narrowing of the opening can detrimentally affect subsequent processes, including adhesion/barrier layer deposition and metal filling deposition frequently resulting in degraded device functions such as electrical pathway open circuits.

The embodiments of the present disclosure have several advantageous features. By incurring re-sputtering in the deposition steps, the conformity of the resulting seed layers is significantly improved. The subsequent etch steps further improve the conformity of the resulting seed layers. The resulting seed layers are substantially overhang-free. The asymmetry between metal lines in the center portions and metal lines in the edge portions of the wafer is also reduced.

Some embodiments of the present disclosure provide a semiconductor structure, including an etching stop layer over an inter-layer dielectric (ILD) layer, a low-k dielectric layer over the etching stop layer, and a tapered aperture at least going into the low-k dielectric layer; wherein the tapered aperture is filled with copper (Cu), a width of a mouth surface portion of the aperture tapers inwardly from a first, wider width to a second, narrower width at a bottom surface portion of the aperture, and the width of the bottom surface portion of the tapered aperture is less than 50 nm.

In some embodiments of the present disclosure, the tapered aperture goes through the low-k dielectric layer and stops at the etching stop layer.

In some embodiments of the present disclosure, the semiconductor structure further includes a barrier layer covering sidewalls and the bottom surface of the aperture.

In some embodiments of the present disclosure, the semiconductor structure further includes a seed layer over the barrier layer.

In some embodiments of the present disclosure, the etching stop layer includes a material selected from a group consisting essentially of SiC, SIN, tetra-ethyl-ortho-silicate (TEOS), or hard black diamond (HBD).

In some embodiments of the present disclosure, the low-k dielectric layer includes a low dielectric constant material having a dielectric constant of about 3 or an extra low dielectric constant material having a dielectric constant of about 2.5.

In some embodiments of the present disclosure, the barrier layer includes a material selected from a group consisting essentially of tantalum nitride, tantalum, titanium, and titanium nitride.

In some embodiments of the present disclosure, the seed layer includes copper (Cu).

Some embodiments of the present disclosure provide a method of fabricating a semiconductor structure. The method includes: forming an etching stop layer over an inter-layer dielectric (ILD) layer; forming a low-k dielectric layer over the etching stop layer; forming a nitrogen free anti-reflection layer (NFARL) over the low-k dielectric layer; forming a metal-hard-mask (MHM) layer over the NFARL; and forming a tapered aperture at least going through the MHM layer, the NFARL and into the low-k dielectric layer; wherein the tapered aperture is filled with copper, a width of a mouth surface portion of the aperture tapers inwardly from a first, wider width to a second, narrower width at a bottom surface portion of the aperture, and the width of the bottom surface portion of the tapered aperture is less than 50 nm.

In some embodiments of the present disclosure, the tapered aperture goes through the low-k dielectric layer and stops at the etching stop layer.

In some embodiments of the present disclosure, the method further includes depositing a barrier layer covering sidewalls and the bottom surface of the aperture.

In some embodiments of the present disclosure, the method further includes depositing a seed layer over the barrier layer.

In some embodiments of the present disclosure, the MHM layer includes a material of TiN.

In some embodiments of the present disclosure, the mouth surface portion at the upper end around the top corner of the aperture may have a geometric polygonal shape seen from the cross-sectional view.

In some embodiments of the present disclosure, the mouth surface portion at the upper end around the top corner of the aperture may have a continuous curved shape seen from the cross-sectional view.

Some embodiments of the present disclosure provide a method of fabricating a semiconductor structure. The method includes: forming an etching stop layer over an inter-layer dielectric (ILD) layer; forming a low-k dielectric layer over the etching stop layer; forming a nitrogen free anti-reflection layer (NFARL) over the low-k dielectric layer; forming a metal-hard-mask (MHM) layer over the NFARL; and performing an etch operation to form a tapered aperture at least going through the MHM layer, the NFARL and into the low-k dielectric layer; wherein the tapered aperture is filled with copper, a width of a mouth surface portion of the aperture tapers inwardly from a first, wider width to a second, narrower width at a bottom surface portion of the aperture, and the width of the bottom surface portion of the tapered aperture is less than 50 nm.

In some embodiments of the present disclosure, the tapered aperture goes through the low-k dielectric layer and stops at the etching stop layer.

In some embodiments of the present disclosure, performing the etch operation includes applying an etching bias power having a range of about 100 W-1000 W.

In some embodiments of the present disclosure, performing the etch operation includes using plasma etching gas including octafluorocyclobutane ($C_4F_8$) gas.

In some embodiments of the present disclosure, performing the etch operation comprises using plasma etching gas including tetrafluoromethane ($CF_4$) gas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, comprising:
   forming an etching stop layer over an inter-layer dielectric (ILD) layer;

forming a dielectric layer over the etching stop layer;
forming a nitrogen free anti-reflection layer (NFARL) over the dielectric layer;
forming a metal-hard-mask (MHM) layer over the NFARL;
forming a tapered aperture at least going through the MHM layer, the NFARL and into the dielectric layer; and
filling the tapered aperture with copper;
wherein the tapered aperture tapers inwardly from a mouth surface portion to a bottom surface portion, wherein a width of the mouth surface portion is greater than a width of the bottom surface portion, and the width of the bottom surface portion is less than about 50 nm.

2. The method of claim 1, wherein the tapered aperture goes through the dielectric layer and stops at the etching stop layer.

3. The method of claim 1, further comprising depositing a barrier layer covering sidewalls and the bottom surface of the tapered aperture.

4. The method of claim 3, further comprising depositing a seed layer over the barrier layer.

5. The method of claim 1, wherein the MHM layer comprises TiN.

6. The method of claim 1, wherein the mouth surface portion at the upper end around a top corner of the tapered aperture has a geometric polygonal shape seen from a cross-sectional view.

7. The method of claim 1, wherein the mouth surface portion at the upper end around a top corner of the tapered aperture has a continuous curved shape seen from a cross-sectional view.

8. A method of fabricating a semiconductor structure, comprising:
forming an etching stop layer over an inter-layer dielectric (ILD) layer;
forming a dielectric layer over the etching stop layer;
forming a nitrogen free anti-reflection layer (NFARL) over the dielectric layer;
forming a metal-hard-mask (MHM) layer over the NFARL;
performing an etch operation to form a tapered aperture at least going through the MHM layer, the NFARL and into the dielectric layer; and
filling the tapered aperture with copper;
wherein the tapered aperture tapers inwardly from a mouth surface portion to a bottom surface portion, wherein a width of the mouth surface portion is greater than a width of the bottom surface portion, and the width of the bottom surface portion is less than about 50 nm.

9. The method of claim 8, wherein the tapered aperture goes through the dielectric layer and stops at the etching stop layer.

10. The method of claim 8, wherein the performing of the etch operation comprises applying an etching bias power having a range of about 100 W-1000 W.

11. The method of claim 8, wherein the performing of the etch operation comprises using plasma etching gas including octafluorocyclobutane ($C_4F_8$) gas.

12. The method of claim 8, wherein the performing of the etch operation comprises using plasma etching gas including tetrafluoromethane ($CF_4$) gas.

13. A method of fabricating a semiconductor structure, comprising:
providing a dielectric layer;
forming a first layer over the dielectric layer;
forming a second layer over the first layer;
forming a first opening in the second layer to expose a portion of the first layer;
forming a second opening at the exposed first layer to expose a portion of the dielectric layer, wherein a diameter of a top of the second opening is narrower than a diameter of a bottom of the first opening; and
performing an etch operation upon the first opening and the second opening to form a tapered aperture at least going through the first layer, the second layer and into the dielectric layer.

14. The method of claim 13, further comprising filling the tapered aperture with copper, wherein the tapered aperture tapers inwardly from a mouth surface portion to a bottom surface portion, wherein a width of the mouth surface portion is greater than a width of the bottom surface portion, and the width of the bottom surface portion is less than about 50 nm.

15. The method of claim 13, wherein the first layer comprises nitrogen free anti-reflection layer (NFARL).

16. The method of claim 13, wherein the second layer comprises TiN, Ti, Ta, W, TaN or WN.

17. The method of claim 14, further comprising depositing a barrier layer covering sidewalls and the bottom surface of the aperture.

18. The method of claim 17, further comprising depositing a seed layer over the barrier layer.

19. The method of claim 14, wherein the mouth surface portion at the upper end around a top corner of the tapered aperture has a geometric polygonal shape seen from a cross-sectional view.

20. The method of claim 14, wherein the mouth surface portion at the upper end around a top corner of the tapered aperture has a continuous curved shape seen from a cross-sectional view.

* * * * *